(12) United States Patent
Liu et al.

(10) Patent No.: US 12,476,143 B2
(45) Date of Patent: Nov. 18, 2025

(54) BACKSIDE REACTIVE INHIBITION GAS

(71) Applicant: Lam Research Corporation, Fremont, CA (US)

(72) Inventors: Gang Liu, Fremont, CA (US); Anand Chandrashekar, Fremont, CA (US); Tsung-Han Yang, San Jose, CA (US); Michael Bowes, Scotts Valley, CA (US); Leonard Wai Fung Kho, San Francisco, CA (US); Eric H. Lenz, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 659 days.

(21) Appl. No.: 17/904,703

(22) PCT Filed: Feb. 17, 2021

(86) PCT No.: PCT/US2021/018347
§ 371 (c)(1),
(2) Date: Aug. 19, 2022

(87) PCT Pub. No.: WO2021/167958
PCT Pub. Date: Aug. 26, 2021

(65) Prior Publication Data
US 2022/0415711 A1    Dec. 29, 2022

Related U.S. Application Data

(60) Provisional application No. 62/980,019, filed on Feb. 21, 2020.

(51) Int. Cl.
*C23C 16/04* (2006.01)
*C23C 16/32* (2006.01)
(Continued)

(52) U.S. Cl.
CPC ........ *H01L 21/76879* (2013.01); *C23C 16/32* (2013.01); *C23C 16/34* (2013.01);
(Continued)

(58) Field of Classification Search
CPC ........ C23C 16/04; C23C 16/045; C23C 16/56
See application file for complete search history.

(56) References Cited

U.S. PATENT DOCUMENTS 5,080,933 A    1/1992  Grupen-Shemansky et al.
5,476,548 A    12/1995 Lei et al.
(Continued)

FOREIGN PATENT DOCUMENTS

CN    1930322 A      3/2007
EP    1719167 B1    10/2011
(Continued)

OTHER PUBLICATIONS

Canova, Kinsey L., et al., "Using metal precursors to passivate oxides for area selective deposition". J. Vac. Sci. Technol. A 41(3) May/Jun. 2023; 003407-1 to 003407-9.*
(Continued)

*Primary Examiner* — Bret P Chen
(74) *Attorney, Agent, or Firm* — Weaver Austin Villeneuve & Sampson LLP

(57) ABSTRACT

Provided herein are methods and apparatuses for controlling uniformity of processing at an edge region of a semiconductor wafer. In some embodiments, the methods include providing a backside inhibition gas as part of a deposition-inhibition-deposition (DID) sequence.

13 Claims, 15 Drawing Sheets

(51) Int. Cl.
    *C23C 16/34*     (2006.01)
    *C23C 16/455*     (2006.01)
    *C23C 16/56*     (2006.01)
    *H01L 21/285*     (2006.01)
    *H01L 21/768*     (2006.01)

(52) U.S. Cl.
    CPC .. *C23C 16/45527* (2013.01); *C23C 16/45553* (2013.01); *C23C 16/45565* (2013.01); *C23C 16/56* (2013.01); *H01L 21/28506* (2013.01)

(56) References Cited

U.S. PATENT DOCUMENTS

| | | | |
|---|---|---|---|
| 5,552,124 | A | 9/1996 | Su |
| 6,040,011 | A | 3/2000 | Yudovsky et al. |
| 6,296,712 | B1 | 10/2001 | Guo et al. |
| 6,374,512 | B1 | 4/2002 | Guo et al. |
| 2001/0042514 | A1 | 11/2001 | Mizuno et al. |
| 2004/0020599 | A1 | 2/2004 | Tanaka et al. |
| 2005/0196971 | A1 | 9/2005 | Sen et al. |
| 2011/0263123 | A1 | 10/2011 | Gomi et al. |
| 2013/0000558 | A1 | 1/2013 | Hara et al. |
| 2013/0171822 | A1* | 7/2013 | Chandrashekar ....... C23C 16/04 118/696 |
| 2013/0269737 | A1 | 10/2013 | Mizuno |
| 2013/0302980 | A1* | 11/2013 | Chandrashekar ..... C23C 16/045 438/666 |
| 2016/0024650 | A1 | 1/2016 | Toyoda et al. |
| 2016/0307742 | A1 | 10/2016 | Mishra et al. |
| 2016/0355928 | A1 | 12/2016 | Toriya et al. |
| 2017/0218517 | A1 | 8/2017 | Fukiage et al. |
| 2018/0053660 | A1* | 2/2018 | Jandl .................... C23C 16/045 |
| 2018/0090344 | A1 | 3/2018 | Kim et al. |
| 2018/0112309 | A1 | 4/2018 | Kamio et al. |
| 2018/0138074 | A1 | 5/2018 | Lee et al. |
| 2018/0277431 | A1* | 9/2018 | Chandrashekar ..... H01L 21/324 |
| 2020/0035787 | A1* | 1/2020 | Wang ................ H01L 21/76876 |
| 2021/0375591 | A1 | 12/2021 | Chandrashekar et al. |

FOREIGN PATENT DOCUMENTS

| | | |
|---|---|---|
| JP | H0881775 A | 3/1996 |
| JP | H08227857 A | 9/1996 |
| JP | H0982653 A | 3/1997 |
| JP | H10298767 A | 11/1998 |
| JP | H11219918 A | 8/1999 |
| JP | 2000054137 A | 2/2000 |
| JP | 2000290774 A | 10/2000 |
| JP | 2001329370 A | 11/2001 |
| JP | 2002518601 A | 6/2002 |
| JP | 2002363756 A | 12/2002 |
| KR | 20140045806 A | 4/2014 |
| KR | 101937692 B1 | 1/2019 |
| TW | 201401428 A | 1/2014 |
| TW | 201920750 A | 6/2019 |
| TW | 202002126 A | 1/2020 |
| WO | WO-2019204754 A1 | 10/2019 |

OTHER PUBLICATIONS

Prosini, P.P., et al., "Effect of substrate surface treatment on the nucleation and crystal growth of electrodeposited copper and copper-indium alloys". Thin Solid Films vol. 298, Issues 1-2, Apr. 20, 1997, pp. 191-196.*
International Preliminary Report on Patentability dated Oct. 29, 2020 in PCT Application PCT/US2019/028362.
International Preliminary Report on Patentability dated Sep. 1, 2022, in PCT Application No. PCT/US2021/018347.
International Search Report & Written Opinion dated Aug. 9, 2019 in PCT Application PCT/US2019/028362.
International Search Report and Written Opinion dated Jun. 8, 2021 in PCT Application No. PCT/US2021/018347.
JP Office Action dated May 30, 2023 in Application No. JP 2020-557974 with English translation.
KR Office Action dated Jan. 22, 2024 in KR Application No. 10-2020-7033442 with English Translation.
TW Office Action dated Dec. 13, 2022 in Application No. TW108113695 with English translation.
U.S. Non-Final Office Action dated Nov. 21, 2023 in U.S. Appl. No. 15/733,766.
U.S Restriction requirement dated Aug. 7, 2023 in U.S. Appl. No. 15/733,766.
CN Office Action dated Dec. 4, 2024 in CN Application No. 201980036351.9, with English Translation.
CN Office Action dated May 24, 2024 in CN Application No. 201980036351.9 with English translation.
Inlet. "Merriam-Webster.com Dictionary, Merriam-Webster," [https://www.merriam-webster.com/dictionary/inlet]. Accessed Jun. 21, 2024.
KR Office Action dated Sep. 26, 2024 in KR Application No. 10-2020-7033442 with English Translation.
Over. "Merriam-Webster.com Dictionary, Merriam-Webster," [https://www.merriam-webster.com/dictionary/over]. Accessed Jun. 21, 2024.
TW Office Action dated Oct. 14, 2024 in TW Application No. 110105760 with English translation.
U.S. Final Office Action dated Jun. 27, 2024 in U.S. Appl. No. 15/733,766.
KR Decision to Grant and Search Report dated May 26, 2025 in KR Application No. 10-2020-7033442, with English translation.
U.S. Non-Final Office Action dated Feb. 12, 2025 in U.S. Appl. No. 15/733,766.

* cited by examiner

BACKSIDE REACTIVE INHIBITION GAS

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

A challenge in semiconductor processing is achieving uniformity across large areas of a semiconductor wafer. Discontinuities at the edge regions of a wafer can make uniform processing difficult.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Provided herein are methods and apparatuses for controlling uniformity of processing at an edge region of a semiconductor wafer. In some embodiments, the methods include providing a backside inhibition gas as part of a deposition-inhibition-deposition (DID) sequence.

One aspect of the disclosure relates to a method including: providing a substrate having a metal deposited in features in the substrate surface the substrate having a frontside, a backside, and an edge; and performing a non-plasma inhibition treatment on the deposited metal including flowing an inhibition gas from a gas inlet on the frontside of the substrate and flowing the inhibition gas from the backside of the substrate around the edge of the substrate. In some embodiments, the non-plasma inhibition treatment further includes flowing a metal precursor from a gas inlet on the frontside of the substrate. In some embodiments, no metal precursor is flowed from the backside of the substrate. In some embodiments, flowing the inhibition gas from the gas inlet on the frontside of the substrate is performed concurrently or partially overlaps with flowing the inhibition gas from the backside of the substrate. In some embodiments, flowing the inhibition gas from the gas inlet on the frontside of the substrate is alternated with flowing the inhibition gas from the backside of the substrate. In some such embodiments, the non-plasma inhibition treatment includes an anneal period between flowing the inhibition gas from a gas inlet on the frontside of the substrate and flowing the inhibition gas from the backside of the substrate.

In some embodiments, the metal is one of tungsten (W), molybdenum (Mo), cobalt (Co), and ruthenium (Ru). In some embodiments, the inhibition gas is nitrogen-containing. In some embodiments, the inhibition gas is ammonia ($NH_3$) or hydrazine ($N_2H_4$).

In some embodiments, the method further includes, after the non-plasma inhibition treatment, exposing the features to a metal precursor and a reducing agent to deposit metal in the features, wherein the deposition of the metal is delayed on the inhibited surfaces. In some such embodiments, the non-plasma inhibition treatment and the deposition operation are performed in different stations of a multi-station chamber.

In some embodiments, providing a substrate having a metal deposited in features in the substrate surface includes depositing metal in the features.

In some embodiments, flowing the inhibition gas from the backside of the substrate around the edge of the substrate includes flowing the inhibition gas from the backside of the substrate to a volume under an exclusion ring.

Another aspect of the disclosure relates to an apparatus including a multi-station chamber, each station including a pedestal including a top surface and an annular recess in the top surface configured to be fluidically connected to a backside gas source; an exclusion ring installed on the pedestal; and a showerhead disposed over the pedestal and configured to be fluidically connected to a frontside gas source; and a controller including instructions for: flowing a metal precursor and a reducing through the showerhead of a first station housing a substrate to deposit a metal film thereon; transferring the substrate to a second station and flowing a metal precursor and an inhibition gas through the showerhead and flowing the inhibition gas from the backside gas source through the annular recess; and transferring the substrate to a third station and flowing a metal precursor and a reducing agent through the showerhead to deposit a metal film thereon.

In some embodiments, the controller includes instructions for flowing the inhibition gas through the annular recess without flowing metal precursor through the annular recess. In some embodiments, the controller includes instructions for flowing the inhibition gas from the showerhead concurrently or partially overlapping with flowing the inhibition gas through the annular recess. In some embodiments, the controller includes instructions for alternating the flow of the inhibition gas from the showerhead with the flow of the inhibition gas through the annular recess.

A further aspect of the disclosure relates to an apparatus including a chamber including a pedestal including a top surface and an annular recess in the top surface configured to be fluidically connected to a backside gas source; an exclusion ring installed on the pedestal; and a showerhead disposed over the pedestal and configured to be fluidically connected to a frontside gas source; and a controller including instructions for: flowing a metal precursor and a inhibition gas through the showerhead and flowing the inhibition gas without a metal precursor through the annular recess.

In some embodiments, the controller includes instructions for flowing the inhibition gas through the annular recess without flowing metal precursor through the annular recess. In some embodiments, the controller includes instructions for flowing the inhibition gas from the showerhead concurrently or partially overlapping with flowing the inhibition gas through the annular recess. In some embodiments, the controller includes instructions for alternating the flow of the inhibition gas from the showerhead with the flow of the inhibition gas through the annular recess.

These and other aspects are described below with reference to the Drawings.

DETAILED DESCRIPTION

Examples of various embodiments are illustrated in the accompanying drawings and described further below. It will be understood that the discussion herein is not intended to limit the claims to the specific embodiments described. On the contrary, it is intended to cover alternatives, modifications, and equivalents as may be included within the spirit and scope of the disclosure and the appended claims. In the following description, numerous specific details are set forth in order to provide a thorough understanding of the disclosed subject matter. Various implementations of subject may be practiced without some or all these specific details. In other instances, well-known process operations have not been described in detail in order not to unnecessarily obscure the subject matter described herein.

Provided herein are methods for controlling process uniformity at an edge region of a semiconductor wafer. In some embodiments, the methods include providing a backside inhibition gas. In some embodiments, the backside inhibition gas may be provided as part of a deposition-inhibition-deposition (DID) sequence. Also provided are related apparatus.

Figure 1:
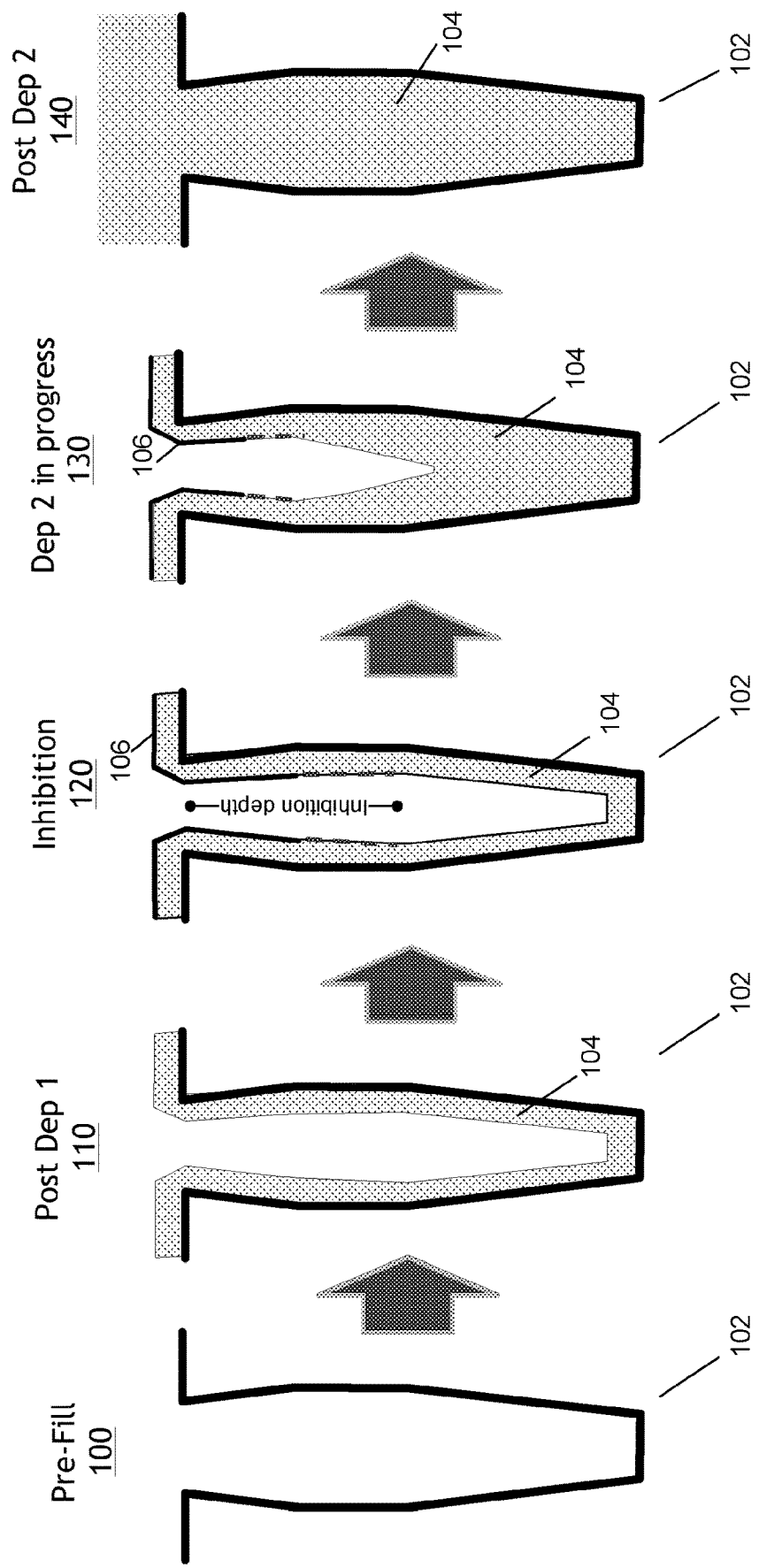
FIG. 1 illustrates a deposition-inhibition-deposition (DID) process for feature fill that may be used in implementations of the disclosure.

A DID sequence may be used to fill a feature with metal, dielectric, or other material. FIG. 1 shows an example of a DID process that may be implemented according to various embodiments. First, at 100, an unfilled feature 102 is shown at a pre-fill stage. The feature 102 may be formed in one or more layers on a semiconductor substrate. The sidewalls and/or bottom of the feature may be lined with one or more thin films of material. At 110, the feature 102 is shown after an initial deposition (Dep 1) of the fill material. The initial deposition forms a layer of the material 104.

As indicated above, the fill material may be a conductive material, dielectric material, or other material. In some embodiments, the fill material is a metal. Examples of metals include tungsten (W), cobalt (Co), molybdenum (Mo), ruthenium (Ru), and titanium (Ti). In some embodiments, the fill material is a metal compound film such as titanium nitride (TiN). Examples of dielectric materials includes oxides, nitrides, and carbides. Examples of oxides include silicon dioxide ($SiO_2$) and aluminum oxide ($Al_2O_3$). Examples of nitrides include silicon nitride (SiN). Examples of carbides include silicon carbide (SiC).

The initial deposition may be performed by any appropriate process, including an atomic layer deposition (ALD) or chemical vapor deposition (CVD) process. Physical vapor deposition (PVD) processes such as sputtering may be employed in some embodiments.

In an ALD process, the feature is exposed to alternating pulses of reactant gases. In the example of tungsten deposition, a tungsten-containing precursor such as tungsten hexafluoride, ($WF_6$), tungsten hexachloride ($WCl_6$), tungsten pentachloride ($WCl_5$), tungsten hexacarbonyl ($W(CO)_6$), or a tungsten-containing organometallic compound may be used. In some embodiments, pulses of the tungsten-containing precursor are pulsed with a reducing agent such as hydrogen ($H_2$), diborane ($B_2H_6$), silane ($SiH_4$), or germane ($GeH_4$). In a CVD method, the wafer is exposed to the reactant gases simultaneously. Example deposition chemistries for other films are provided below.

At 120, the feature 102 is shown after an inhibition treatment. The inhibition treatment is a surface treatment that inhibits subsequent deposition. Treated surfaces 106 are shown at the top of the feature 102. In the example of FIG. 1, the treatment extends partway into the feature 102 to an inhibition depth.

The mechanism of inhibition depends on the surface to be treated and the inhibition chemistry. In the methods described herein, the inhibition is generally is a thermal, non-plasma process. In one example, tungsten nucleation is inhibited by exposing a surface to a nitrogen-containing chemistry. This can involve exposure to ammonia vapor in an example of a thermal, non-plasma process.

In some embodiments, inhibition can involve a chemical reaction between inhibition species and the feature surface to form a thin layer of a compound material. For example, nitrogen-containing inhibition species may react with tungsten to form a thin layer of tungsten nitride (WN). In another example, carbon-containing inhibition species may react with tungsten to form a thin layer of tungsten carbide (WC). In some embodiments, inhibition can involve a surface effect that passivates the surface without forming a layer of a compound material. For example, nitrogen-containing inhibition species may adsorb on a tungsten film. The methods described herein do not rely on a detailed or complete understanding of the physical mechanisms that cause the inhibition behavior.

The inhibition treatment may be characterized by an inhibition depth and an inhibition gradient. That is, the inhibition may vary with depth, such that the inhibition is greater at the feature opening than at the bottom of the feature and may extend only partway into the feature. In other embodiments, the inhibition treatment may extend to the full depth of the treatment. In the example of FIG. 1, the inhibition depth is about half of the full feature depth. In addition, the inhibition treatment in the example of FIG. 1 is stronger at the top of the feature, as graphically shown by the dotted line deeper within the feature. In other embodiments, inhibition treatment may be the same within the feature as at the top of the feature.

At 130, a subsequent deposition (Dep 2) is shown. Because deposition is inhibited near the opening of the feature 102, the material is preferentially deposited at the feature bottom. The material is not deposited or deposited to a lesser extent near the feature opening. This can prevent the formation of voids and seams within the filled feature. In some embodiments, the fill during Dep 2 is bottom up. This is contrast to the Dep 1 deposition, which conformally coated the feature. As the deposition continues, the inhibition effect may be removed, such that deposition on the lightly treated surfaces may no longer be inhibited. This effect can be seen illustrated at 130, with the treated surfaces 106 being less extensive than prior to the Dep 2 stage. In the example of FIG. 1, as the Dep2 proceeds, the inhibition is eventually overcome on all surfaces. The feature is completely filled with the material 104 as shown at 140.

While DID process in FIG. 1 shows the feature preferentially inhibited at the top of the feature, in some embodiments, the entire feature may be inhibited. Such a process can be useful for preventing line bending, for example.

During the DID process, managing the edge regions of a substrate presents challenges in obtaining uniform films up to the edge of the substrate. In the deposition operations, this can be addressed by flowing a backside inert gas such as argon (Ar); the backside inert gas can be used to tune the deposition of gas at the edge. However, a backside inert gas can be insufficient to address lack of uniformity at the substrate edge during inhibition. As a result, inhibition near or at the edge of a substrate is reduced, which results in a thicker overall film.

In the methods described herein, the inhibition treatment includes flowing the inhibition gas from the backside of the substrate. This allows the inhibition to be tuned and results in center-to-edge uniformity. While a DID process is illustrated above, the methods may be used in any sequence that employs an inhibition operation.

Implementations of the methods herein can be performed using exclusion rings during semiconductor processing. An exclusion ring (also referred to as a minimum overlap exclusion ring or MOER) installed on a wafer support can be used to manage gas flow and process environments along the edge of a wafer. An example of an exclusion ring that may be used in implementations of the methods described herein is described below with reference to FIGS. 2A-2E.

Figure 2A:
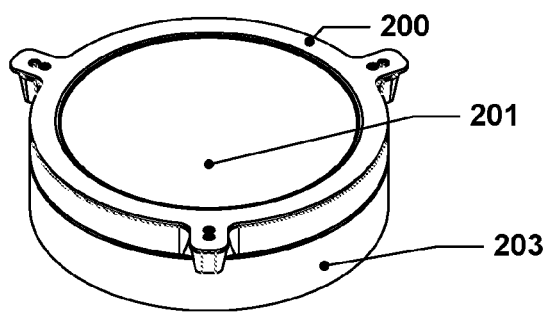
FIG. 2A depicts an isometric view of an example of an exclusion ring installed on a wafer support that may be used in implementations of the disclosure.
Figure 2B:
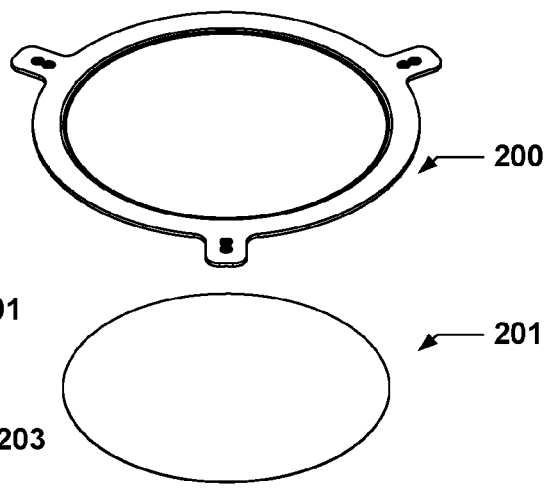
FIG. 2B shows an exploded isometric view of an example of an exclusion ring, wafer, and wafer support that may be used in implementations of the disclosure.
Figure 2B:
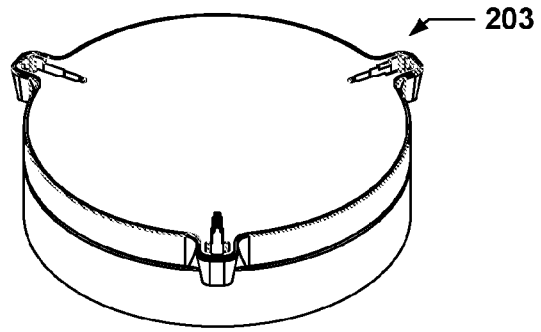

In FIG. 2A, an isometric view of an exclusion ring installed on a wafer support is depicted. An exclusion ring 200 may be used to manage gas flow and process environments along the edge of a wafer 201, which may be supported by a wafer support 203. FIG. 2B shows an exploded isometric view of the exclusion ring 200, the wafer 201, and wafer support 203.

Figure 2C:
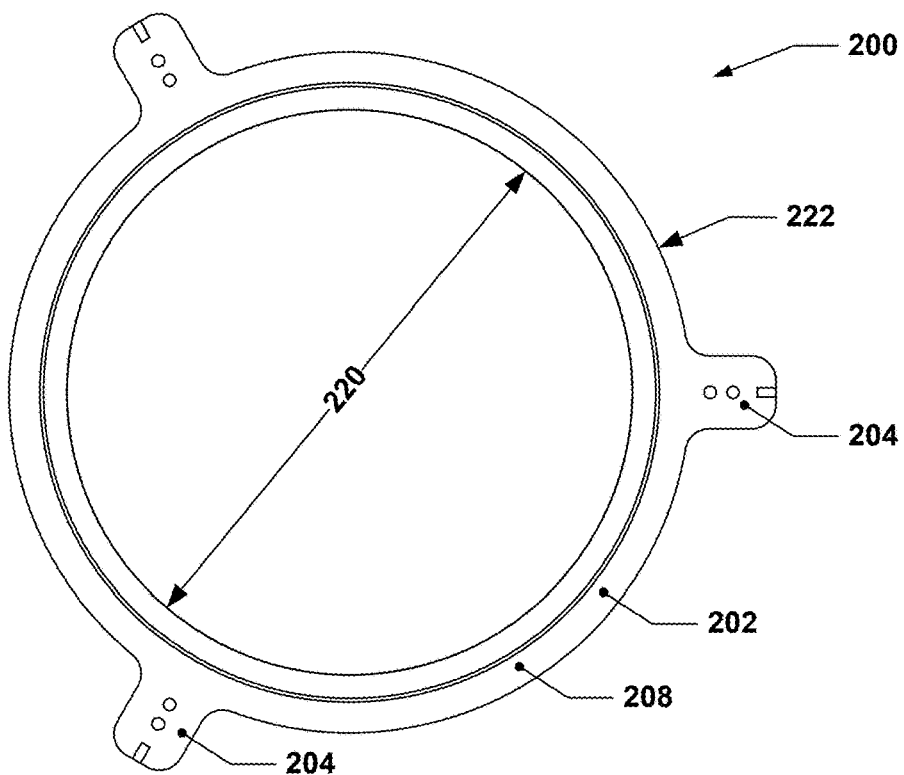
FIGS. 2C and 2D show bottom and top views, respectively of an example of an exclusion ring that may be used in implementations of the disclosure.
Figure 2D:
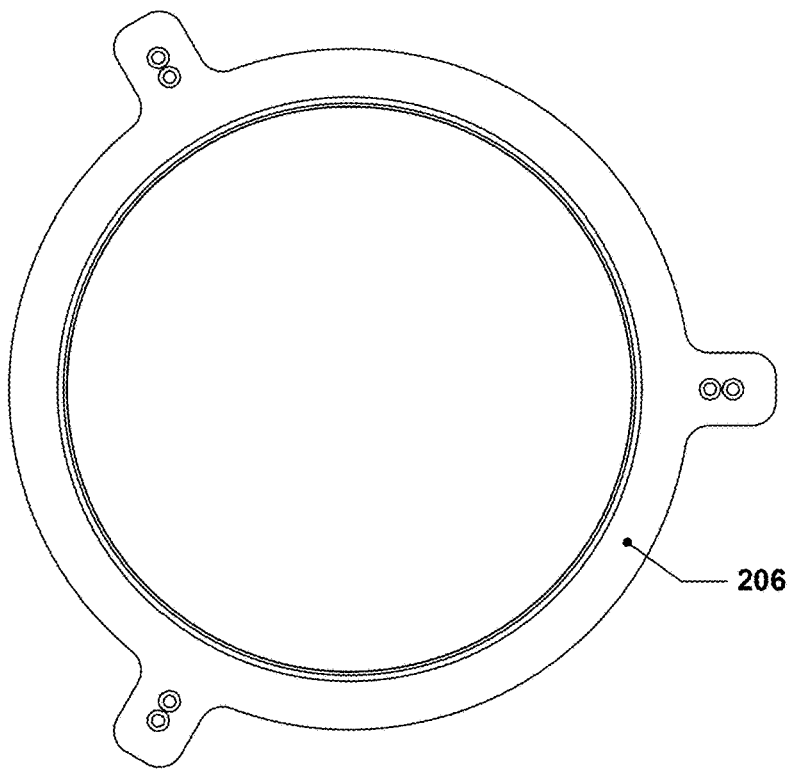

FIGS. 2C and 2D show bottom and top views, respectively, of an exclusion ring. The exclusion ring 100 may be broadly described as a thin, annular ring with an inner diameter 220 and an outer diameter 222. The exclusion ring 200 may, in some implementations, include a plurality of tabs 204 that project from the outer perimeter of the annular ring 202 in a radial direction. The top surface 206 and bottom surface 208 of the exclusion ring 200 may be substantially parallel to a reference plane that is perpendicular to the center axis of the annular ring. The terms "top" and "bottom," with respect to exclusion rings, refer to the surfaces of the exclusion rings that appear to be "top" and "bottom" when the exclusion rings are in use in a semiconductor processing environment. There may be portions of the top surface 206 and the bottom surface 208 that are not parallel to the reference plane. For example, the bottom surface 208 of the exclusion ring 200 may feature a recess that allows the exclusion ring 200 to be placed over a semiconductor wafer without resting on the semiconductor wafer. The inner diameter 222 of the exclusion ring 200 may be smaller than the nominal diameter of the semiconductor wafer such there may be some amount of radial overlap of the semiconductor wafer and the exclusion ring 200, e.g., between 0.05" and 0.5", when in use in the methods described herein. The recess may be contained within an intermediate diameter larger than the nominal diameter of the semiconductor wafer. The portion of the bottom surface 208 where the transition to the recess occurs may be sloped. The transition portion may represent a limited region where the bottom surface is not parallel to the reference plane. As a whole, however, the top surface 206 and the bottom surface 208 may be substantially parallel to the reference plane—such that most of radial distances of the surfaces are parallel to the reference plane. The top surface 206 and the bottom surface 208 may be offset from each other a distance greater than the nominal thickness of the semiconductor wafer.

Figure 2E:
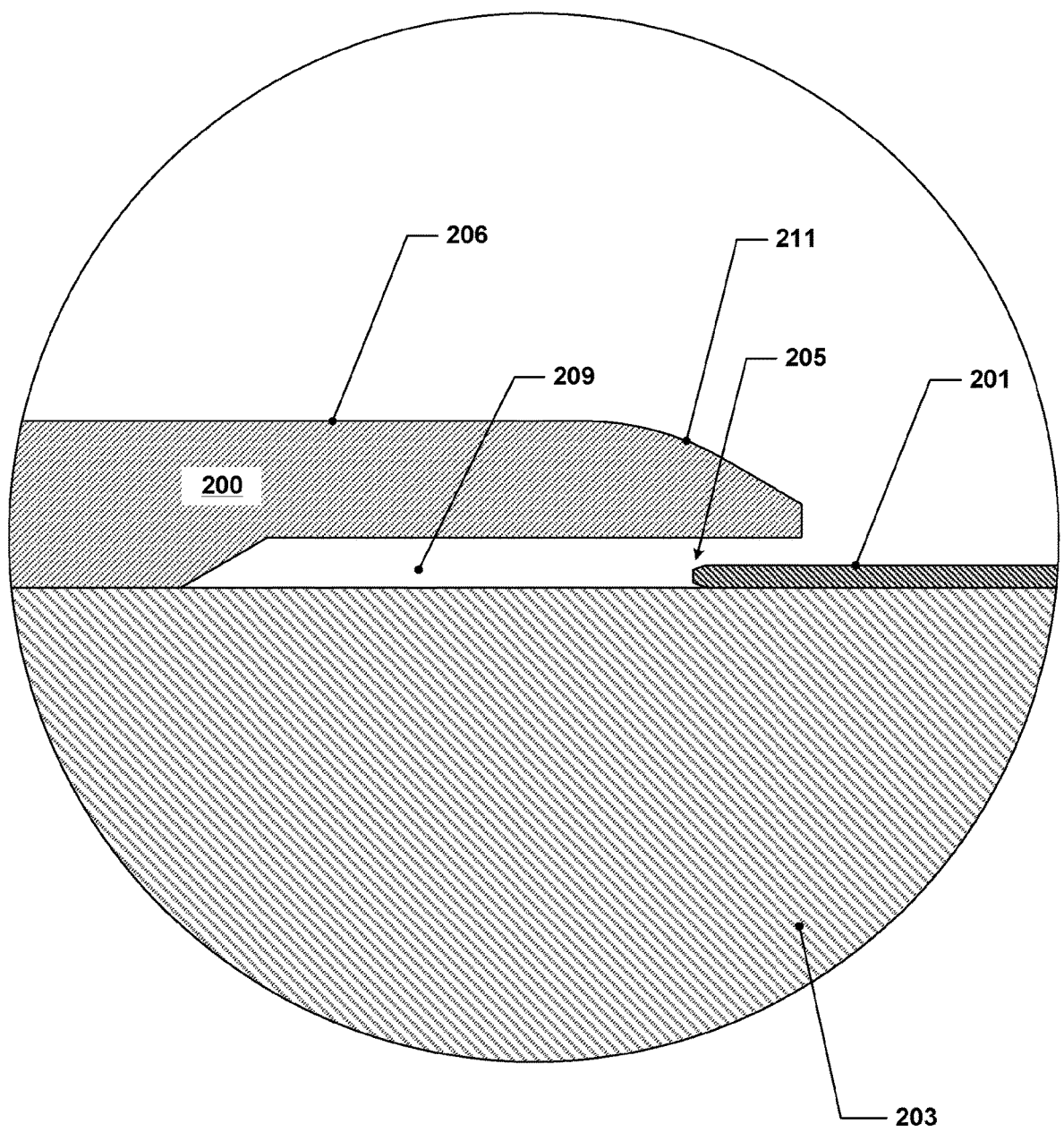
FIG. 2E shows enlarged cross-sectional detail view of an exclusion ring and wafer that may be used in implementations of the disclosure.

The top surface 206 of the exclusion ring 200 may include a sloped portion. FIG. 2E shows an example of an enlarged cross-sectional detail view of the edges of the wafer 201 and the exclusion ring 200. As shown, the top surface 206 includes a sloped portion 211. The wafer 201 is disposed in a recess 209 of the exclusion ring 200 such that the edge 205 of the wafer is disposed directly under the exclusion ring 200. The edge 205 of the wafer 201 is a bevel edge, which slopes from the horizontal top surface of the wafer. In some embodiments, it can be useful to avoid deposition of materials on the bevel. For example, following deposition of a relatively thick (e.g., 2000 Å) film such as tungsten, a chemical-mechanical planarization (CMP) process may be performed to planarize the film. Avoiding deposition on a bevel edge is useful because the deposition on a bevel is not removed by planarization.

Figure 3A:
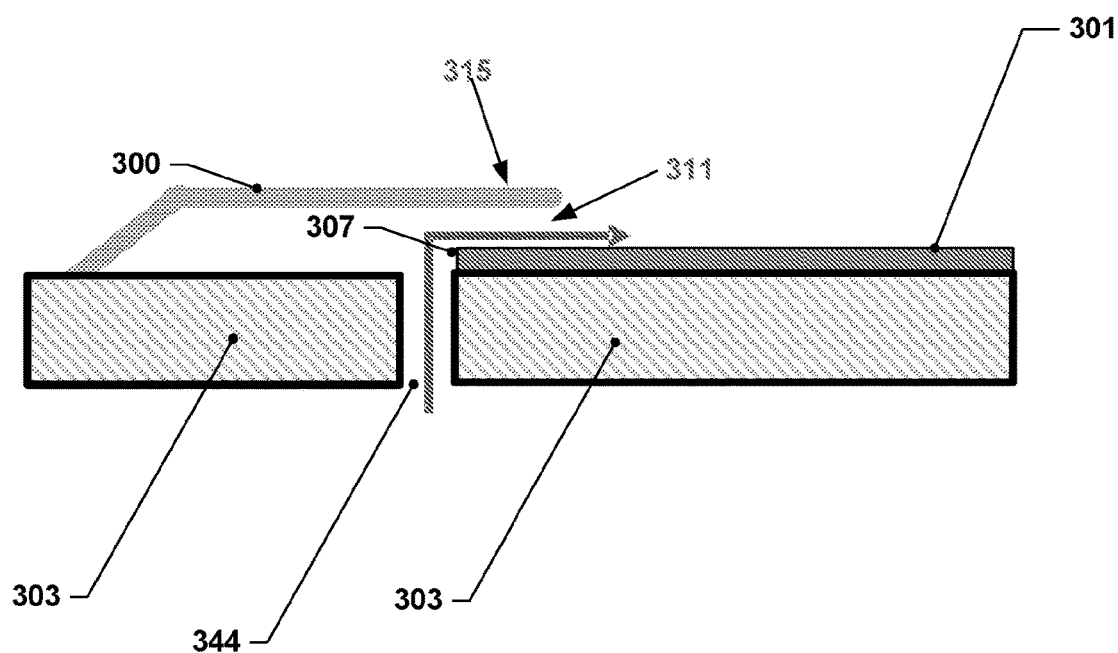
FIG. 3A shows a schematic illustration of an example arrangement of a pedestal including backside gas injection and an exclusion ring that may be used in implementations of the disclosure.

In deposition of a material, such as tungsten, an exclusion ring can be used to modulate deposition at the wafer edge. FIG. 3A shows a schematic illustration of a wafer support 303 that includes an exclusion ring 300. An annular recess 344 in the wafer support 303 allows backside injection of gases. For example, a backside gas such argon (Ar) and/or hydrogen ($H_2$) can be flowed to prevent deposition gases from reaching the edge 305 of a wafer 301. The exclusion ring 300 prevents backside deposition by directing the flow of the backside gas at the edge 305 in the volume created by the exclusion ring 300, the wafer support 303, and the wafer 301. As shown in FIG. 3, the exclusion ring 300 extends over the wafer 301 with a gap 311 between the top of the wafer 301 and the exclusion ring 300. The portion of the exclusion ring 300 that extends over the wafer 301 is referred to at the overhang 315.

Various parameters may be modulated to control the deposition profile at the edge. These include the overhang 315, the gap 311, a gap between the exclusion ring 300 and the showerhead (not shown), the flow rate of the backside gas, and type of backside gas.

Figure 3B:
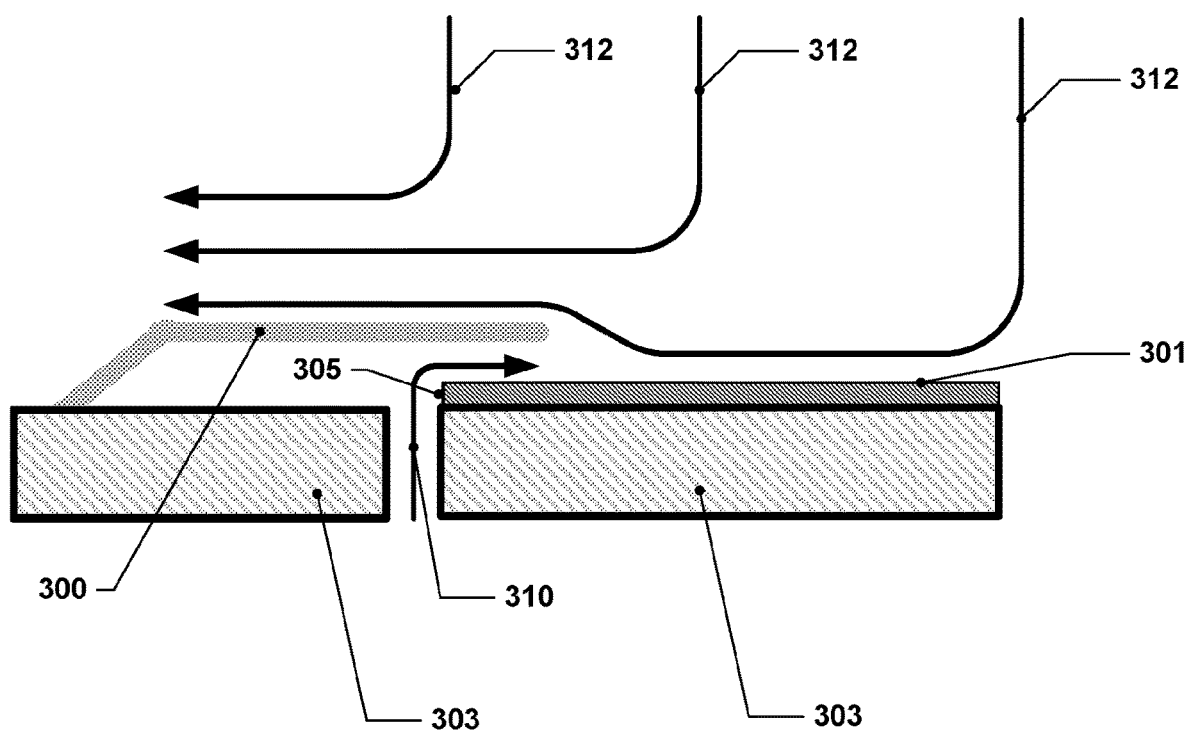
FIG. 3B shows a schematic illustration of process gas and backside gas streamlines during deposition using an example arrangement of a pedestal including backside gas injection and an exclusion ring.

In one example illustrated in FIG. 3B, in deposition of tungsten, the backside gas (e.g., Ar/$H_2$) flow as indicated by streamline 310 under an exclusion ring 300 pushes back the deposition gas (e.g., $WF_6$) preventing it from reaching the edge 305 of the wafer 301 and thus preventing deposition of tungsten at the edge. The profile of the exclusion ring 300 causes the streamlines 312 of gas flow from the showerhead that are traveling radial out above the wafer to bend up around the ring. This bending up lowers the concentration of $WF_6$ or other tungsten precursor gas close to the wafer's surface by the ring.

Figure 3C:
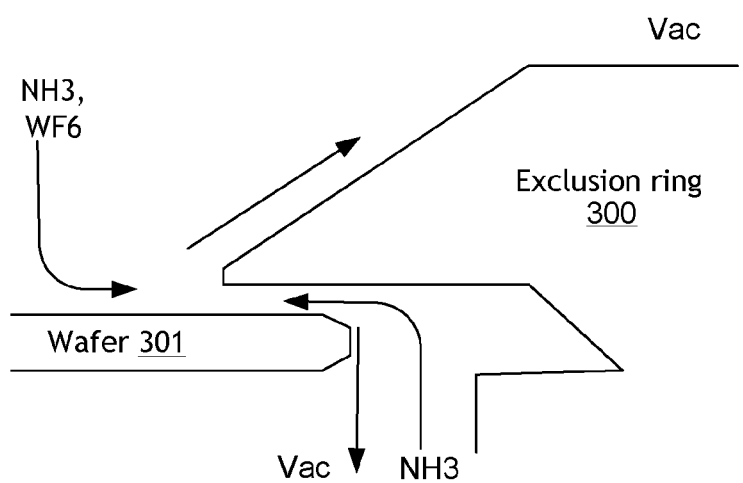
FIGS. 3C-3E shows an example of a schematic arrangement of an exclusion ring and wafer during an inhibition process according to an example of a methods of inhibiting tungsten nucleation according to implementations of the disclosure.

In embodiments disclosed herein, during inhibition, a reactive inhibition gas is flowed from the backside. As shown further below, this significantly improves uniformity across the substrate. FIG. 3C shows an example of an exclusion ring 300 during an inhibition process. In the illustrated embodiment, an inhibition gas ($NH_3$ in the example) and tungsten precursor ($WF_6$ in the example) are flowed from a showerhead (not shown) on the wafer frontside. The inhibition gas ($NH_3$) is also flowed under the exclusion ring 300. Two vacuums are shown: one above the exclusion ring and one on the backside. Flow rates and vacuum strength may be modulated to obtain a uniform inhibition profile. It should be noted that while a metal precursor may be flowed on the frontside during inhibition, it is generally not flowed on the backside to avoid unwanted deposition in the pedestal and/or backside gas passages.

While FIGS. 2A-2E and 3A-3C show examples of exclusion rings that may be used in implementations described herein, any exclusion ring that confines or otherwise allows gas to be directed at the edge of the substrate may be used. Additional examples of exclusion rings that may be used are shown in FIGS. 3D-3G.

Figure 3D:
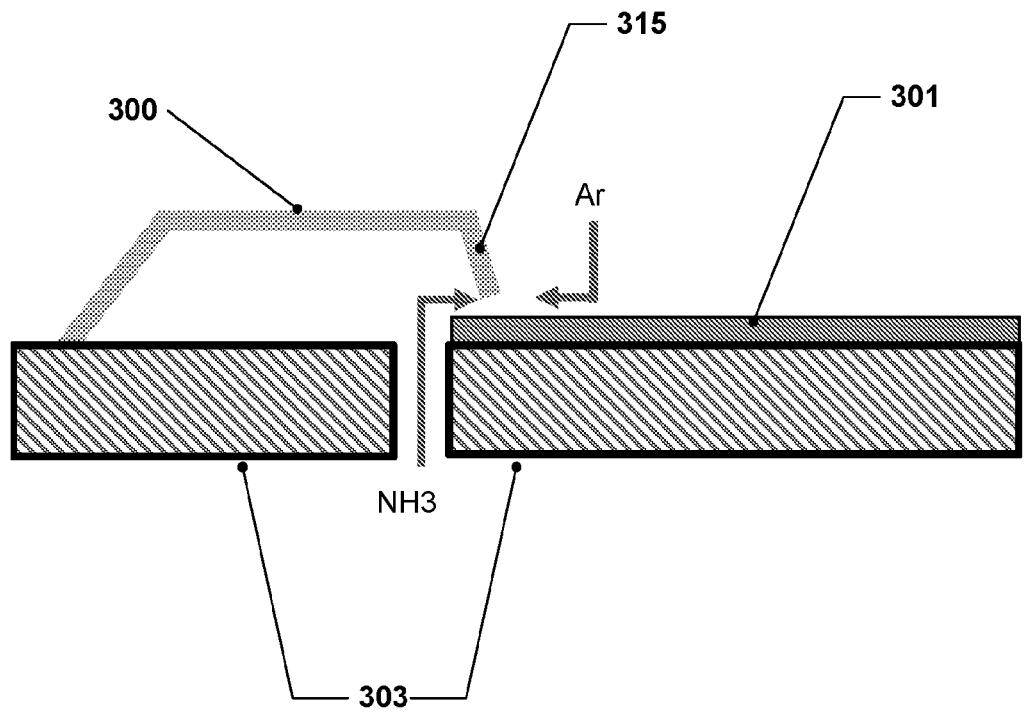
Figure 3E:
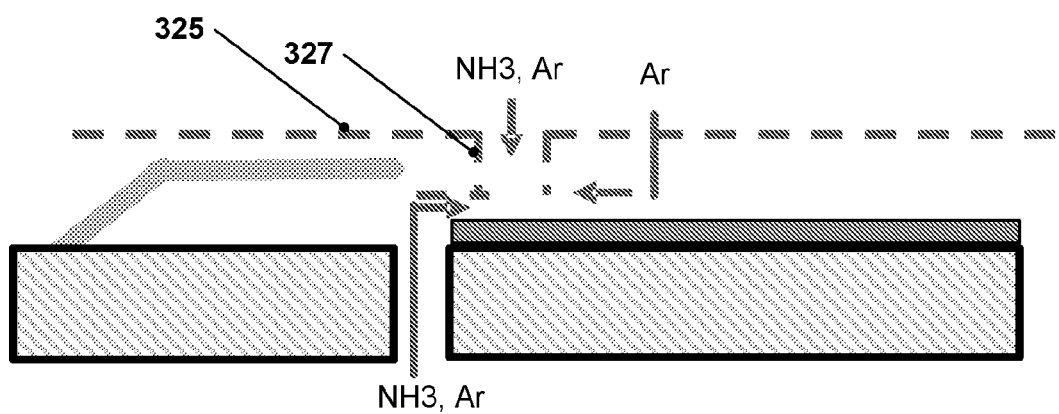

In FIG. 3D, the inhibition gas (e.g., $NH_3$) is added from the backside through the pedestal 303 as in the above examples. Here, the exclusion ring 300 provides a physical barrier 315 to the backside gas, creating an exclusion zone near the bevel (e.g., between 0 and 1 mm or 0 and 2 mm from the edge) of the wafer 301. Ar or other inert gas may be flowed at other regions to control the diffusion of the inhibition gas outside the exclusion zone. In FIG. 3E, a partition 327 extending from the showerhead 325 may help concentrate gas near the wafer edge. Argon may be flowed from the wafer center to modulate the gas flows. As discussed further below, the backside and frontside inhibition treatments may be sequential, concurrent, or partially overlap. Thus, in some embodiments, an inhibition gas with or without a metal precursor may flow from the center of the wafer.

Figure 3F:
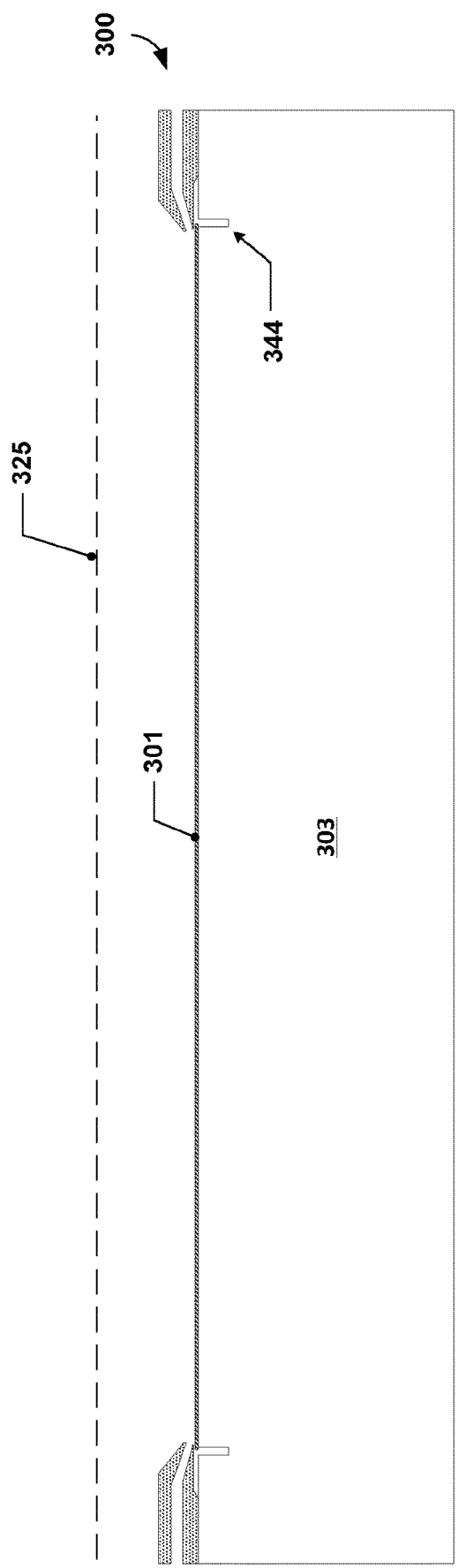
FIG. 3F shows an example exclusion ring assembly having two rings installed on a substrate support that may be used in implementations of the disclosure.

Exclusion rings and associated apparatuses that include multiple planes to direct process gas flows as described in PCT Patent WO 2019/204754 may be used. FIG. 3F shows an exclusion ring 300 having two rings installed on a substrate support 303. The substrate support 303 is shown supporting a substrate, in this example wafer 301. The substrate support 303 includes an annular recess 344 that is in fluid communication with a backside gas source and through which a backside gas may be flowed.

The exclusion ring 300 includes lower and upper rings that may be used to direct flow. For example, during deposition, the lower ring can direct flow of the backside gas to prevent backside deposition or backside and edge deposition. The upper ring can direct the process gas close to the substrate at the edge to control deposition there. In this manner, a material is uniformly deposited up to a threshold distance from the edge, while deposition at the edge and backside is prevented. According to various embodiments, the lower ring and upper ring may be fixed or movable with respect to each other. The amount of gas directed to the edge of the threshold can be controlled by the gap between the showerhead 325 and the upper ring. By moving the upper ring closer to the showerhead 325, more flow goes to the gap between the lower and upper rings, increasing deposition at the edge. Example implementations edge ring assemblies are described further below.

Figure 3G:
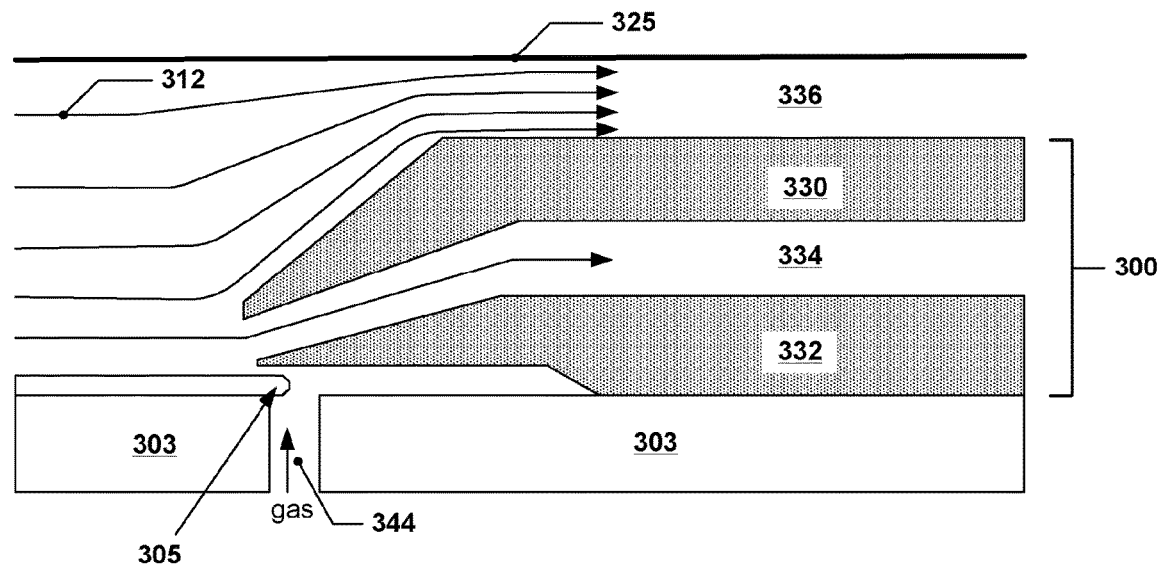
FIGS. 3G and 3H shows schematic illustrations of process gas streamlines for an exclusion ring assembly having two rings at different showerhead-upper ring gaps that may be used in implementations of the disclosure.
Figure 3H:
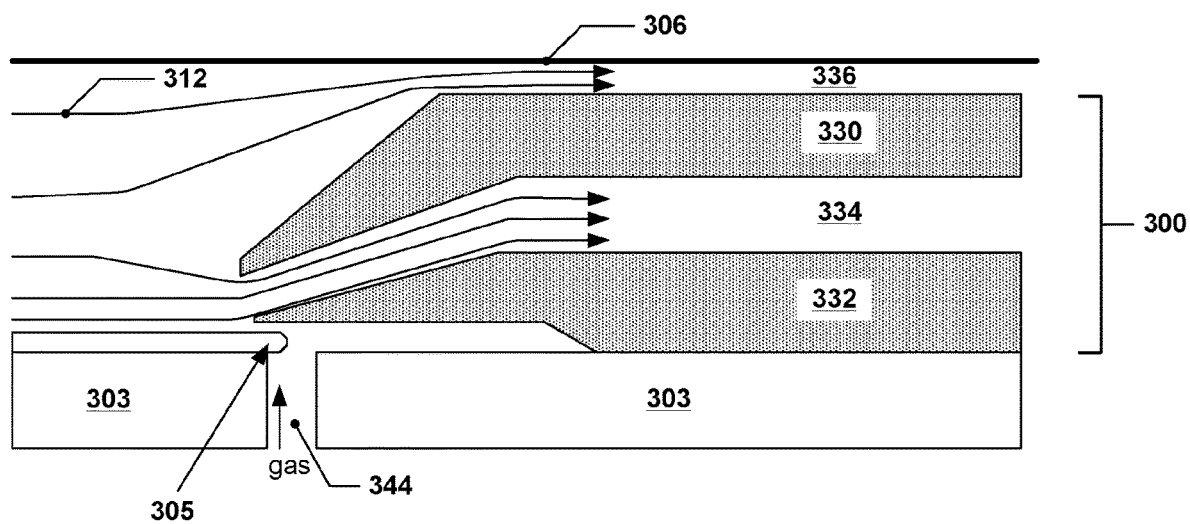

FIGS. 3G and 3H provide schematic illustrations of process gas streamlines 312 for an exclusion ring 300 at different showerhead-upper ring gaps. The exclusion ring 300 includes upper ring 330 and lower ring 332, which may be fixed or variable with respect to each other. An annular gap between the upper ring 330 and the showerhead 325 defines an annular gas flow passage 336. In FIG. 3G, the upper ring 330 is further from the showerhead 325 than in FIG. 3H. More process gas, as represented by the process gas streamlines 312, is pulled through the annular gas flow passage 336 in FIG. 3G than in FIG. 3H.

Backside gas is injected to provide a flow through an annular recess 344 in the pedestal 303. In this manner, the relative sizes of the upper annular gas flow passage 336 and lower annular gas flow passage 334 provide control over the processing gas concentration (and thus the deposition or inhibition or other processing). In some embodiments, the pedestal-showerhead distance may be varied, e.g., by raising or lowering the pedestal.

According to various embodiments, the processing described herein may be used in a deposition process to provide a non-uniformity of less than 1%, where the non-uniformity is measured as 100% (half of the maximum deviation in thickness ($t_{max}-t_{min}$) divided by the average thickness) to a at least 2 mm or 1 mm from the edge of wafer.

Figure 4A:
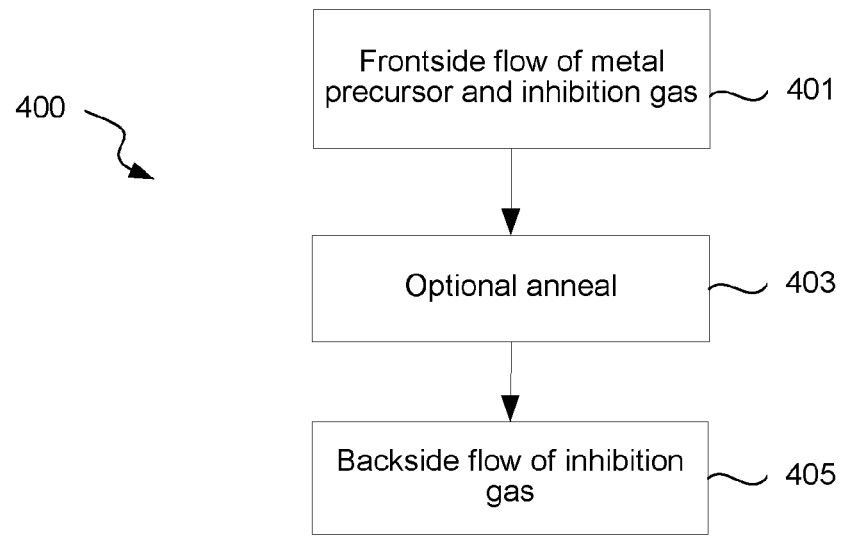
FIGS. 4A and 4B are process flow diagrams showing certain operations in examples of methods of inhibiting nucleation according to implementations of the disclosure.
Figure 4B:
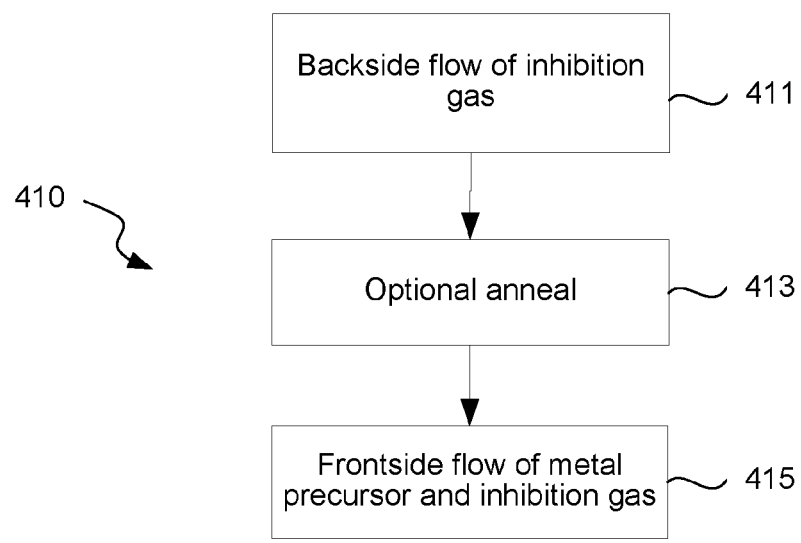

FIGS. 4A and 4B show process flow diagrams for examples of performing inhibition. The methods described in relation to FIGS. 4A and 4B may be implemented, for example, as part of operation 120 in FIG. 1 in a DID process. However, in other embodiments, they may be part of any process sequence that includes an inhibition operation, including inhibition-deposition, inhibition-reduce inhibition-deposition, etc. Further, in some embodiments, the methods may use a gas flow from the frontside or side of the wafer in addition to or instead of a backside gas. Such a gas flow is directed inward radially. A frontside gas that is directed radially outward is also used.

In various embodiments, during an inhibition process, both frontside and backside inhibition processes are performed. In the examples of FIGS. 4A and 4B, the frontside and backside inhibition processes are performed sequentially. In other embodiments, they may be performed at least partially concurrently. In some such embodiments, a frontside flow of a metal precursor and inhibition gas may be used, while a backside flow may have the inhibition gas as the only reactive gas. Carrier gases such as argon (Ar) may be included with one or both of any backside or frontside flow.

For sequential inhibition processes, FIG. 4A shows a first example of a method 400 in which the frontside is first exposed to a thermal, non-plasma inhibition. Frontside inhibition typically involves flowing gas through the showerhead or other gas inlet that directs gas at the frontside of the substrate. In the example of FIG. 4A, operation 401 includes flowing a metal precursor, e.g., $WF_6$, and an inhibition gas, e.g., $NH_3$, but no additional reactive gas such as $H_2$. In other embodiments, the inhibition gas may be the only frontside gas flowed. If both metal precursor and inhibition gas are flowed, they may be co-flowed with a continuous or pulsed flow, or flowed in alternate pulses. During operation 401, an inert gas such as Ar may or may not be flowed from the backside.

Next, in an operation 403, an optional anneal is performed. In some embodiments, the anneal involves an intentional waiting period between the frontside and backside inhibition operations. It may be useful to allow the inhibition to fully take effect. Example anneal times can range from 1 s-200 s.

Next, in an operation 405, an inhibition gas is flowed from the backside. This can involve flowing an inhibition gas in a volume in which the wafer edge is disposed. Such a volume may be formed by an exclusion ring as described above. The top surface of the wafer near the edge can be exposed to the inhibition gas. An inert gas may be flowed from the showerhead to control diffusion of the inhibition gas toward the center of the wafer. While a metal precursor gas can be flowed from the backside in operation 403, in many embodiments, the inhibition gas is the only reactive gas flowed. Metal precursor gases flowed from the backside may result in undesirable deposition in backside flow passages or on the pedestal. Operations 401-405 may be performed once or multiple times in a single inhibition operation, for example, in DID process.

Method 410 in FIG. 4B is similar to method 400, with the order of backside and frontside inhibitions reversed. Thus, in operation 411, an inhibition gas is flowed from the backside as described above with reference to operation 405; in operation 413, an optional anneal is performed as described above with reference to operation 403; and in operation 415, a metal precursor and inhibition gas is flowed as described above with reference to operation 401.

Figure 5:
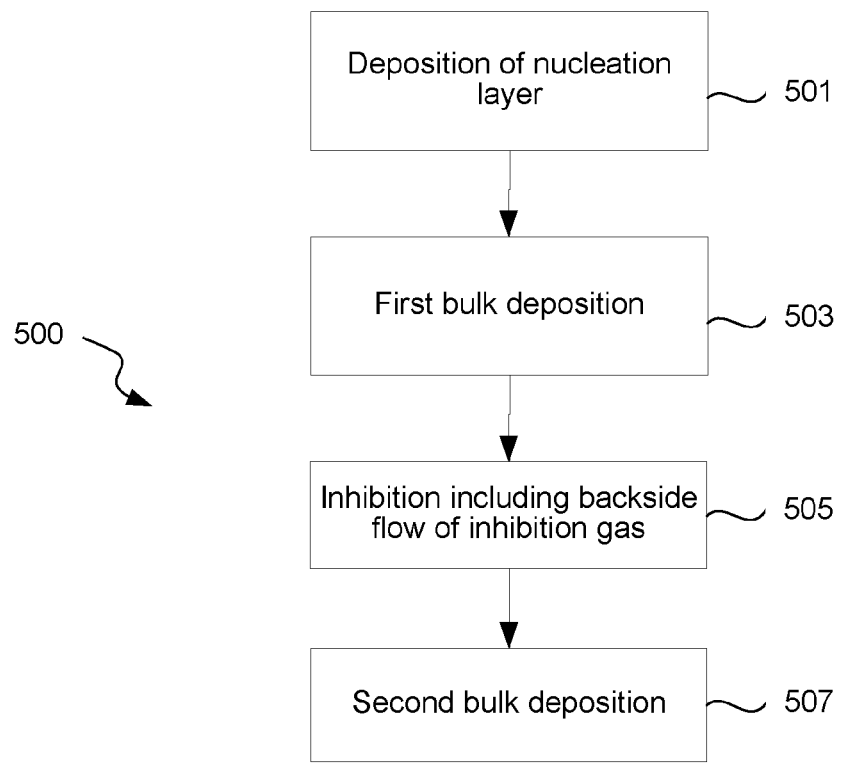
FIG. 5 is a process flow diagram showing certain operations in an example of a method of deposition according to implementations of the disclosure.

FIG. 5 shows a process flow diagram for an example of performing a DID process. First, in an operation 501, a nucleation layer is deposited in a feature. Deposition of a nucleation layer is described more fully below and can involve alternating pulses of a reducing agent and a metal precursor. In some embodiments, the underlying surface can support high quality deposition and the nucleation layer is not deposited. If deposited, a nucleation layer may conformally line the feature surface. Next, a first bulk layer is deposited in an operation 503. This may involve an ALD or CVD process that exposes the feature to a metal precursor and reducing agent. While the metal precursor is often the same precursor as in operation 501, the reducing agent may be a silicon-containing or boron-containing reducing agent in operation 501 and hydrogen in operation 503. In operation 505, an inhibition process is performed including backside flow as described herein. According to various embodiments, the inhibition may be tuned to inhibit preferentially one part of the feature (e.g., at the top of the feature as in the example of FIG. 1) or inhibit uniformly throughout the depth of the feature. In some embodiments, operation 505 is performed on the underlying substrate surface (such that operations 501 and 503 are not performed). And in some embodiments, operation 505 may be performed on the nucleation layer (such that operation 503 is no performed.) As with operation 503, deposition of the second bulk layer can be an ALD or CVD process. Any bulk deposition process that undergoes nucleation delay as a result of the inhibition treatment may be used. A second bulk deposition is then performed in operation 507 with a nucleation delay on the inhibited parts of the feature. In implementations in which operation 503 is not performed, operation 507 may be the first bulk deposition. Operation 507 may be an ALD or CVD operation using a metal precursor and reducing agent. Hydrogen may be used as the reducing agent in many embodiments.

In some embodiments, operation 501 may be omitted. For example, in deposition of a silicon oxide or other dielectric material, a bulk layer may be deposited without a nucleation layer. Certain metal deposition techniques may also be performed without a nucleation layer.

Figure 6A:
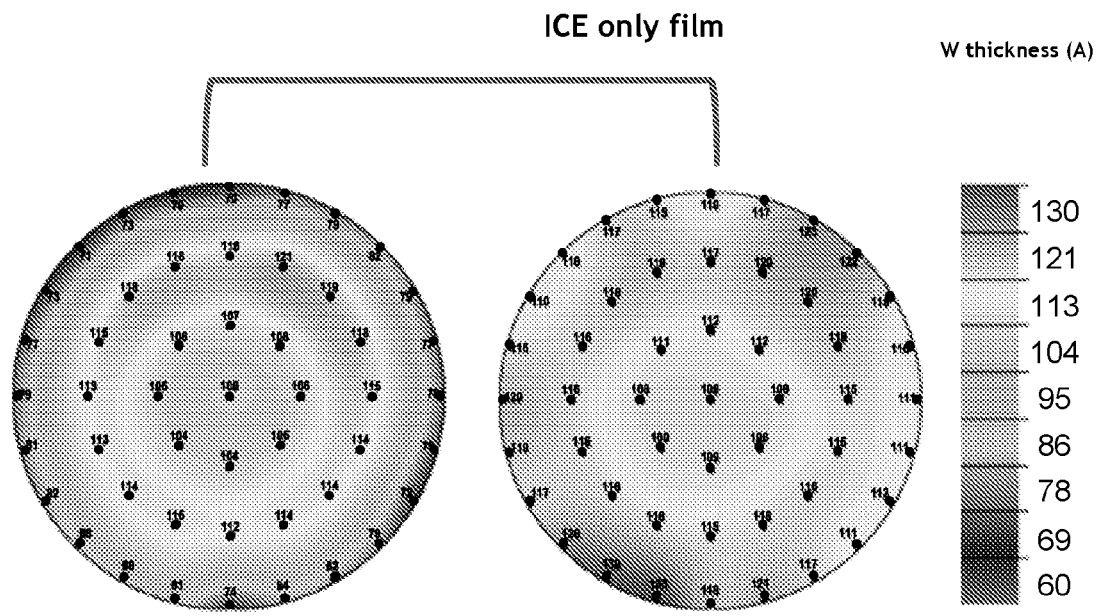
FIGS. 6A and 6B shows plots of measured tungsten thickness after inhibition and deposition-inhibition-deposition processes with and without a backside reactive inhibition gas.
Figure 6B:
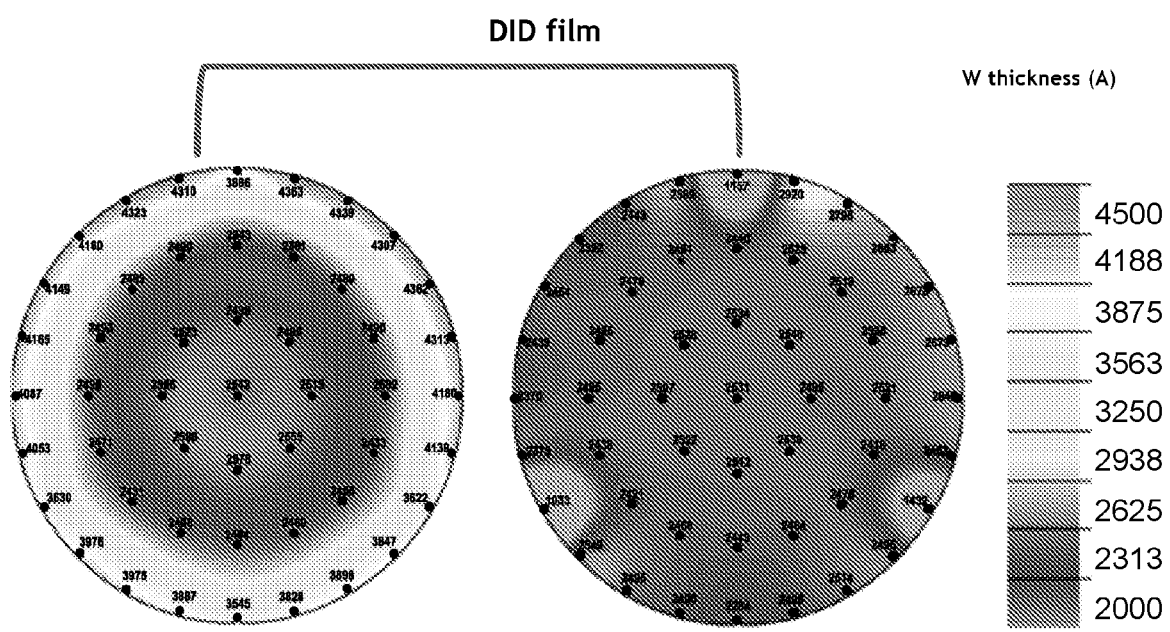

FIGS. 6A and 6B shows uniformity improvement using a backside reactive inhibition gas. Plots of measured tungsten thickness are shown. In FIG. 6A, plot 601 shows results of an inhibition operation without using a backside reactive inhibition gas and plot 603 shows results of an inhibition operation using a backside reactive inhibition gas.

Plot 601 was generated by exposing a wafer to frontside $WF_6/NH_3$ and no reactive gas on the backside. Plot 603 was generated by exposing a wafer to frontside $WF_6/NH_3$ and backside $NH_3$ gas. Although only an inhibition process is used, a small amount of tungsten is deposited due to the presence of the tungsten precursor. Without a backside inhibition gas, a relatively thick tungsten film is at the wafer edge as can be seen in plot 601. As can be seen by comparing the plots, the backside inhibition gas is able to compensate for frontside depletion at the wafer edge such that plot 603 does not show this relatively thick film. Within-wafer non-uniformity is reduced from 19% to 4.6% by the addition of the backside gas.

In FIG. 6B, plot 651 shows results of a DID process without using a backside reactive inhibition gas and plot 653 shows results of a DID process using a backside reactive inhibition gas. Plot 653 is mostly uniform except for three areas of increased thickness due to a pedestal arrangement. Excluding these areas, within-wafer non-uniformity is reduced from 24.9% to 4.2% by the addition of the backside gas.

Figure 7:
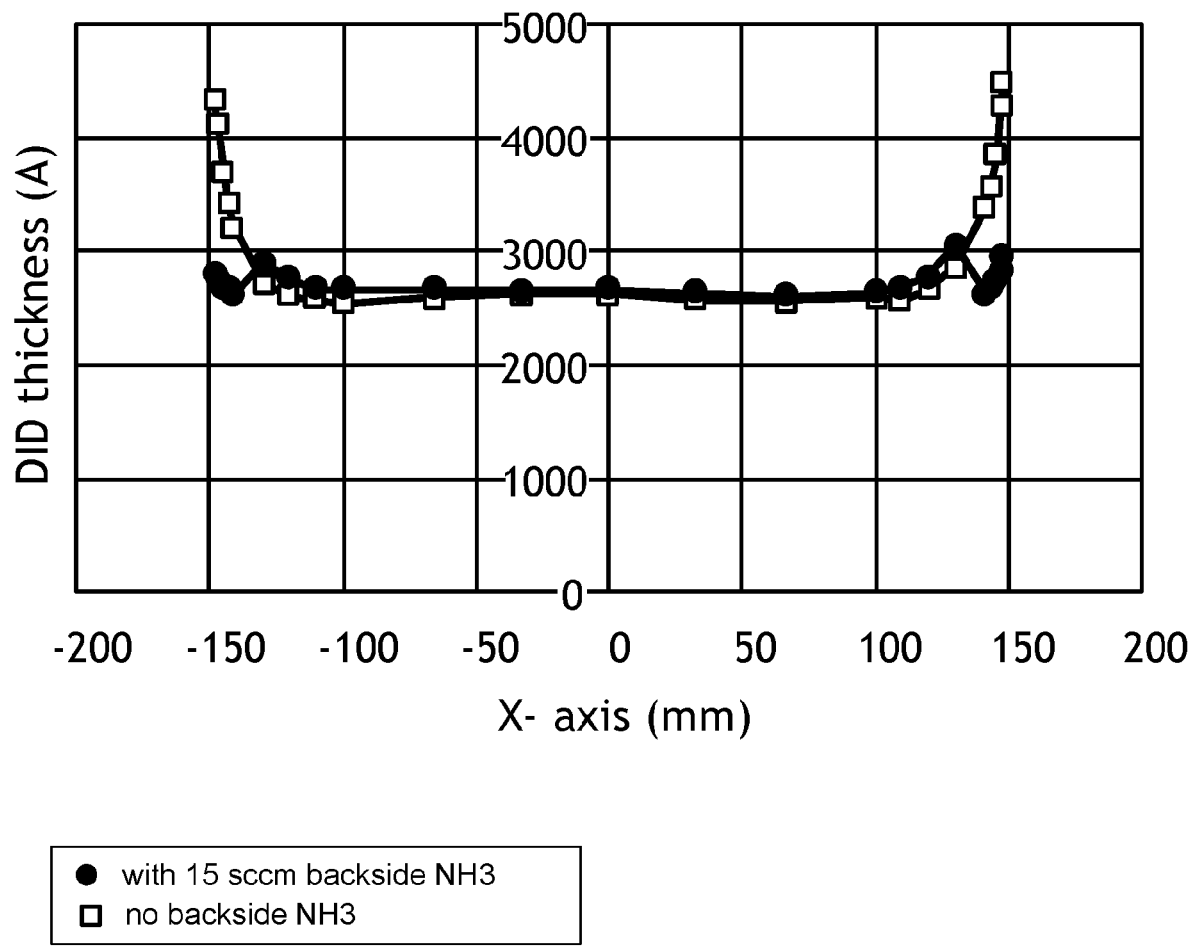
FIG. 7 is a graph showing measured tungsten thickness across a wafer after a deposition-inhibition-deposition process with and without a backside reactive inhibition gas.

FIG. 7 is a plot of thicknesses across a wafer with and without backside reactive gas and demonstrates significant uniformity improvement using backside reactive gas. In particular, the circular data points representing measurements from the no backside $NH_3$ process show thickness increasing significantly near the wafer edges (−150 mm and +150 mm). The square data points representing measurements from the backside $NH_3$ flow process do not show this increase.

The processes described above may be implemented for uniform inhibition in which a process gas is distributed radially from a showerhead in a chamber. Deposition processes that are in continuum flow regime for which uniformity to very close to the edge of the substrate without deposition on edge or backside of the substrate is desired may benefit. These include any CVD or ALD operation including deposition of conductive or dielectric materials including but not limited to tungsten nitride (WN) and tungsten carbide (WC), titanium-containing materials (e.g., titanium (Ti), titanium nitride (TiN), titanium silicide (TiSi), titanium carbide (TiC) and titanium aluminide (TiAl)), tantalum-containing materials, nickel-containing materials, ruthenium-containing material, cobalt-containing materials, molybdenum-containing materials, and the like.

In particular embodiments, the methods may be used as part of inhibition-deposition processes, including DID processes, of cobalt, molybdenum, or ruthenium films or compound films containing these metals.

Metal-Containing Precursors

While $WF_6$ is used as an example of a tungsten-containing precursor in the above description, it should be understood that other tungsten-containing precursors may be suitable for performing disclosed embodiments. For example, a metal-organic tungsten-containing precursor may be used. Organometallic precursors and precursors that are free of fluorine, such as MDNOW (methylcyclopentadienyl-dicarbonylnitrosyl-tungsten) and EDNOW (ethylcyclopentadienyl-dicarbonylnitrosyl-tungsten) may also be used. Chlorine-containing tungsten precursors ($WCl_x$) such as tungsten pentachloride ($WCl_5$) and tungsten hexachloride ($WCl_6$) may be used.

To deposit molybdenum (Mo), Mo-containing precursors including molybdenum hexafluoride ($MoF_6$), molybdenum pentachloride ($MoCl_5$), molybdenum dichloride dioxide ($MoO_2Cl_2$), molybdenum tetrachloride oxide ($MoOCl_4$), and molybdenum hexacarbonyl ($Mo(CO)_6$) may be used.

To deposit ruthenium (Ru), Ru-precursors may be used. Examples of ruthenium precursors that may be used for oxidative reactions include (ethylbenzyl)(1-ethyl-1,4-cyclohexadienyl)Ru(0), (1-isopropyl-4-methylbenzyl)(1,3-cyclohexadienyl)Ru(0), 2,3-dimethyl-1,3-butadienyl)Ru(0)tricarbonyl, (1,3-cyclohexadienyl)Ru(0)tricarbonyl, and (cyclopentadienyl)(ethyl)Ru(II)dicarbonyl. Examples of ruthenium precursors that react with non-oxidizing reactants are bis(5-methyl-2,4-hexanediketonato)Ru(II)dicarbonyl and bis(ethylcyclopentadienyl)Ru(II).

To deposit cobalt (Co), cobalt-containing precursors including dicarbonyl cyclopentadienyl cobalt (I), cobalt carbonyl, various cobalt amidinate precursors, cobalt diazadienyl complexes, cobalt amidinate/guanidinate precursors, and combinations thereof may be used.

The metal-containing precursor may be reacted with a reducing agent as described above. In some embodiments, $H_2$ is used as a reducing agent for bulk layer deposition to deposit high purity films.

Nucleation Layer Deposition

In some implementations, the methods described herein involve deposition of a nucleation layer prior to deposition of a bulk layer. A nucleation layer is typically a thin conformal layer that facilitates subsequent deposition of bulk material thereon. For example, a nucleation layer may be deposited prior to any fill of the feature and/or at subsequent points during fill of the feature (e.g., via interconnect) on a wafer surface. For example, in some implementations, a nucleation layer may be deposited following etch of tungsten in a feature, as well as prior to initial tungsten deposition.

In certain implementations, the nucleation layer is deposited using a pulsed nucleation layer (PNL) technique. In a PNL technique to deposit a tungsten nucleation layer, pulses of a reducing agent, optional purge gases, and tungsten-containing precursor are sequentially injected into and purged from the reaction chamber. The process is repeated in a cyclical fashion until the desired thickness is achieved. PNL broadly embodies any cyclical process of sequentially adding reactants for reaction on a semiconductor substrate, including atomic layer deposition (ALD) techniques. Nucleation layer thickness can depend on the nucleation layer deposition method as well as the desired quality of bulk deposition. In general, nucleation layer thickness is sufficient to support high quality, uniform bulk deposition. Examples may range from 10 Å-100 Å.

The methods described herein are not limited to a particular method of nucleation layer deposition but include deposition of bulk film on nucleation layers formed by any method including PNL, ALD, CVD, and physical vapor deposition (PVD). Moreover, in certain implementations, bulk tungsten may be deposited directly in a feature without use of a nucleation layer. For example, in some implementations, the feature surface and/or an already-deposited under-layer supports bulk deposition. In some implementations, a bulk deposition process that does not use a nucleation layer may be performed.

In various implementations, metal nucleation layer deposition can involve exposure to a metal-containing precursor and a reducing agent, with examples given above. In some implementations, pulses of metal-containing precursor can be alternated with pulses of one or more reducing agents, e.g., S/W/S/W/B/W, etc., W represents a tungsten-containing precursor, S represents a silicon-containing precursor, and B represents a boron-containing precursor. In some implementations, a separate reducing agent may not be used, e.g., a tungsten-containing precursor may undergo thermal or plasma-assisted decomposition.

Bulk Deposition

As described above, bulk deposition may be performed across a wafer. In some implementations, bulk deposition can occur by a CVD process in which a reducing agent and a metal-containing precursor are flowed into a deposition chamber to deposit a bulk fill layer in the feature. An inert carrier gas may be used to deliver one or more of the reactant streams, which may or may not be pre-mixed. Unlike PNL or ALD processes, this operation generally involves flowing the reactants continuously until the desired amount is deposited. In certain implementations, the CVD operation may take place in multiple stages, with multiple periods of continuous and simultaneous flow of reactants separated by periods of one or more reactant flows diverted. Bulk deposition may also be performed using ALD processes in which a metal-containing precursor is alternated with a reducing agent such as $H_2$.

It should be understood that the metal films described herein may include some amount of other compounds, dopants and/or impurities such as nitrogen, carbon, oxygen, boron, phosphorous, sulfur, silicon, germanium and the like, depending on the particular precursors and processes used. The metal content in the film may range from 20% to 100% (atomic) metal. In many implementations, the films are metal-rich, having at least 50% (atomic) metal, or even at least about 60%, 75%, 90%, or 99% (atomic) metal. In some implementations, the films may be a mixture of metallic or elemental metal (e.g., W, Mo, Co, or Ru) and other metal-containing compounds such as tungsten carbide (WC), tungsten nitride (WN), molybdenum nitride (MoN) etc. CVD and ALD deposition of these materials can include using any appropriate precursors as described above.

Inhibition of Metal Nucleation

Thermal inhibition processes generally involve exposing the feature to a nitrogen-containing gas such as ammonia ($NH_3$) or hydrazine ($N_2H_4$) to non-conformally inhibit the feature near the feature opening. In some embodiments, the thermal inhibition processes are performed at temperatures ranging from 250° C. to 450° C. At these temperatures, exposure of a previously formed tungsten or other layer to $NH_3$ results in an inhibition effect. Other potentially inhibiting chemistries such as nitrogen ($N_2$) or hydrogen ($H_2$) may be used for thermal inhibition at higher temperatures (e.g., 900° C.). For many applications, however, these high temperatures exceed the thermal budget. In addition to ammonia, other hydrogen-containing nitriding agents such as hydrazine may be used at lower temperatures appropriate for back end of line (BEOL) applications.

Nitridation of a surface can passivate it. Subsequent deposition of tungsten or other metal such as molybdenum or cobalt on a nitrided surface is significantly delayed, compared to on a regular bulk tungsten film. In addition to $NF_3$, fluorocarbons such as $CF_4$ or $C_2F_8$ may be used. However, in certain implementations, the inhibition species are fluorine-free to prevent etching during inhibition.

In addition to the surfaces described above, nucleation may be inhibited on liner/barrier layers surfaces such as TiN and/or WN surfaces. Any chemistry that passivates these surfaces may be used. Inhibition chemistry can also be used to tune an inhibition profile, with different ratios of active inhibiting species used. For example, for inhibition of W surfaces, nitrogen may have a stronger inhibiting effect than hydrogen; adjusting the ratio of $N_2$ and $H_2$ gas in a forming gas can be used to tune a profile.

In certain implementations, the substrate can be heated up or cooled down before inhibition. A predetermined temperature for the substrate can be selected to induce a chemical reaction between the feature surface and inhibition species and/or promote adsorption of the inhibition species, as well as to control the rate of the reaction or adsorption. For example, a temperature may be selected to have high reaction rate such that more inhibition occurs near the gas source.

In some embodiments, inhibition can involve a chemical reaction between the thermal inhibitor species and the feature surface to form a thin layer of compound material such a metal nitride film. In some embodiments, inhibition can involve a surface effect such as adsorption that passivates the surface without forming a layer of a compound material.

Embodiments of the methods described herein are not limited to a particular inhibition chemistry. The inhibition gas may be referred to as a reactive inhibition gas regardless of the mechanism of inhibition. It is distinguished from inert gases such as helium (He) and argon (Ar) and other non-reactive gases that may be used to direct gas flow without reacting or causing a surface effect.

While inhibition of metal nucleation is described herein, the methods may also be used for other inhibition processes including inhibition of dielectric deposition. Halogen-containing species may be used to inhibition $SiO_2$ deposition for example. In such examples, the inhibition gas may be a halogen-containing gas such as fluorine ($F_2$) or nitrogen trifluoride ($NF_3$).

Apparatus

The methods presented herein may be carried out in various types of deposition apparatuses available from various vendors. Examples of a suitable apparatus include a Concept-1 ALTUS™, a Concept 2 ALTUS™, a Concept-2 ALTUS-S™, Concept 3 ALTUS™ deposition system, ALTUS Max™, ALTUS® Max ICEFill™ or any of a variety of other commercially available deposition tools. Stations in both single station and multi-station deposition apparatuses can be used to perform the methods described above.

Figure 8:
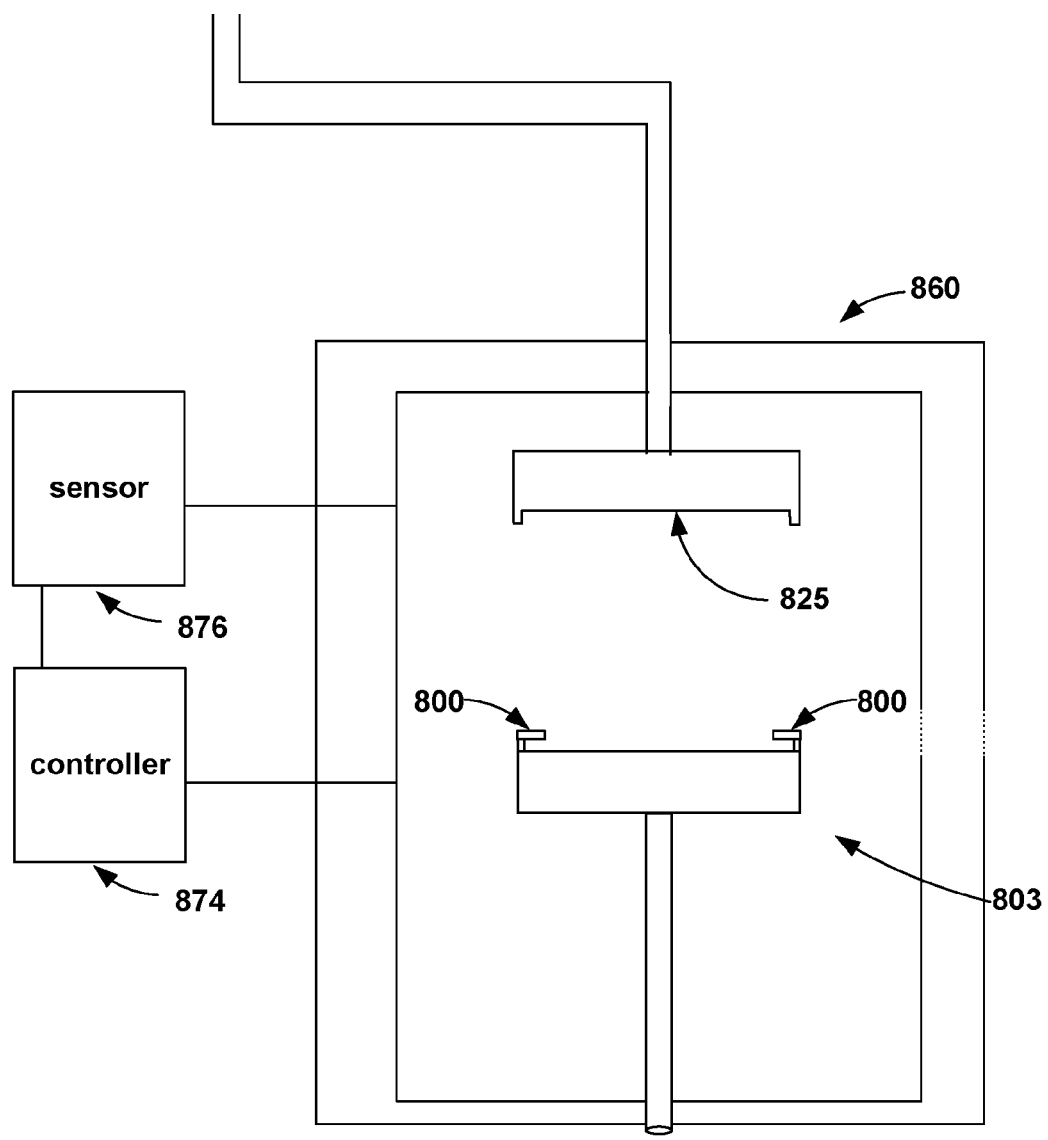
FIG. 8 is a schematic illustration of an example of a processing chamber suitable for deposition and inhibition processes in accordance with implementations of the disclosure.

FIG. 8 shows a deposition station 860 that may be used in accordance with various methods previously described. The deposition station 860 has a substrate support 803 that supports a wafer during deposition. An exclusion ring 800 and showerhead 825 are shown. A process gas may be fed through the showerhead 825. The substrate support 803 may be equipped with a vacuum and an annular recess as shown in FIG. 3F, for example.

Gas sensors, pressure sensors, temperature sensors, etc. may be used to provide information on station conditions during various embodiments. Examples of station sensors that may be monitored during include mass flow controllers, pressure sensors such as manometers, thermocouples located in pedestal, and infra-red detectors to monitor the presence of a gas or gases in the station. In certain embodiments, a controller 874 is employed to control process conditions of the station. Details on types of controllers are further discussed below with reference to FIG. 9. Sensors such as 876 may be used to provide information to the controller 874.

Figure 9:
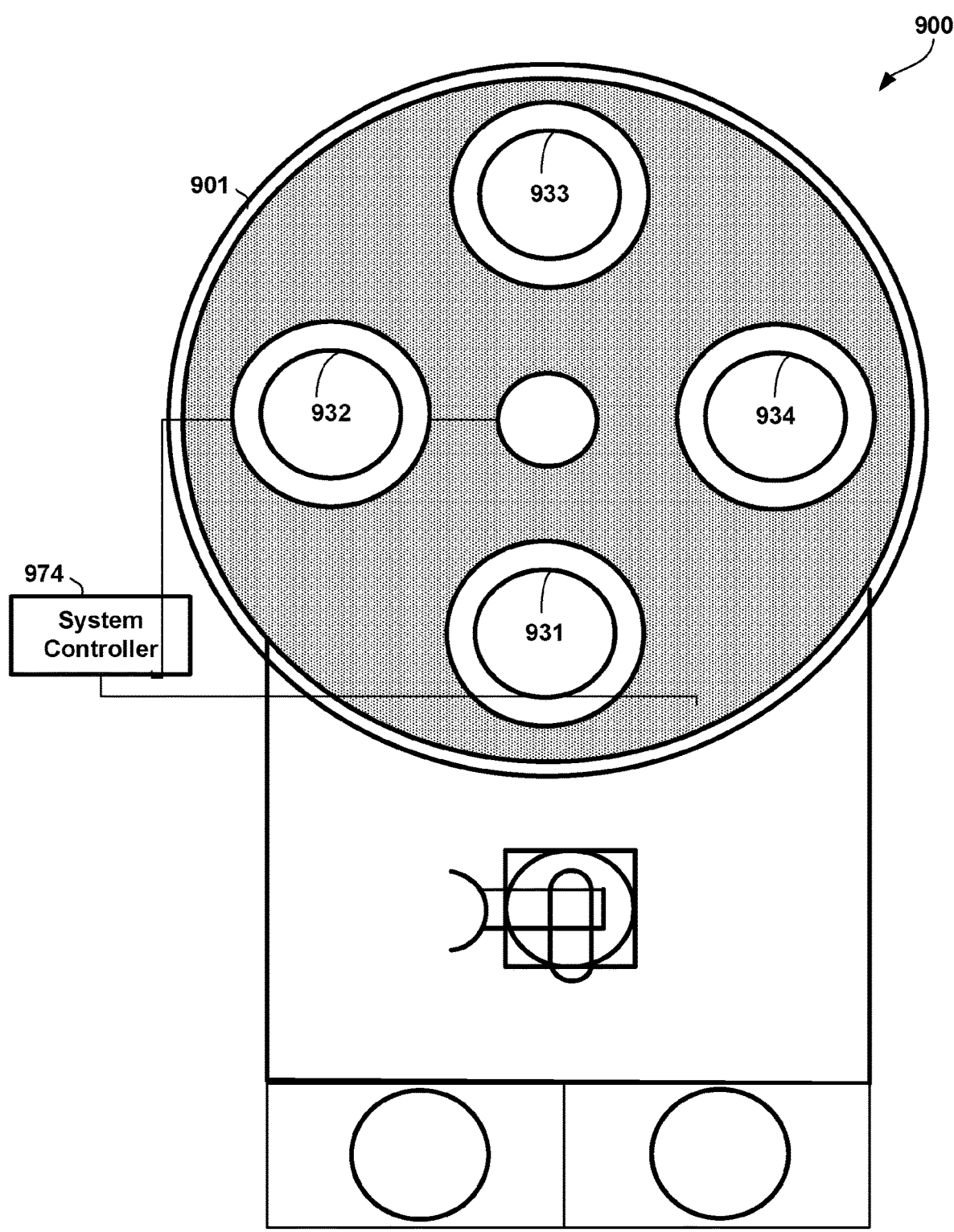
FIG. 9 is a schematic illustration of an example of a processing apparatus suitable for deposition and inhibition processes in accordance with implementations of the disclosure.

FIG. 9 shows an example of a multi-station apparatus that may be used with certain embodiments. The apparatus 900 includes a processing chamber 901, which houses multiple stations. The processing chamber can house at least two stations, or at least three stations, or at least four stations or more. FIG. 9 shows an apparatus 900 with four stations 931, 932, 933, and 934. In some embodiments, all stations in the multi-station apparatus 900 with a processing chamber 901 may be exposed to the same pressure environment controlled by the system controller 974. Sensors (not shown) may also include a pressure sensor to provide chamber pressure readings. However, each station may have individual temperature conditions or other conditions.

In a deposition process, a wafer to be processed may be loaded through a load-lock into the station 931. At this station, a nucleation and/or bulk layer deposition process may be performed. The wafer then may be indexed to station 932 for an inhibition treatment including a backside inhibition gas flow as described above. Bulk deposition may then be performed at stations 933 and 934.

A system controller 974 can control conditions of the indexing, the stations, and the processing chamber, such as the pressure of the chamber. The system controller 974 (which may include one or more physical or logical controllers) controls some or all the operations of a pan apparatus 900. The system controller 974 may include one or more memory devices and one or more processors. In some implementations, the system controller 974 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller, which may control various components or subparts of the system or systems. The system controller depending on the processing parameters and/or the type of system, may be programmed to control any of the processes disclosed herein, including the delivery of processing gases, temperature settings (e.g., heating and/or cooling), pressure settings, vacuum settings, flow rate settings, fluid delivery settings, positional and operation settings, wafer transfers into and out of a tool and other transfer tools and/or load locks connected to or interfaced with a specific system.

Broadly speaking, the system controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the system controller receives instructions in the form of data, which specify parameters for each of the processing steps to be performed during one or more operations. The parameters may be specific to the type of process to be performed and the type of tool that the controller is configured to interface with or control. Thus, as described above, the system controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Patterning Method/Apparatus:

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

We claim:

1. A method comprising:
providing a substrate having a metal deposited in features in the substrate, the substrate having a frontside, a backside, and an edge; and
performing a non-plasma inhibition treatment on surfaces of the deposited metal to inhibit nucleation on the treated surfaces, the non-plasma inhibition treatment comprising flowing an inhibition gas from a gas inlet on the frontside of the substrate and flowing the inhibition gas from the backside of the substrate around the edge of the substrate.

2. The method of claim 1, wherein the non-plasma inhibition treatment further comprises flowing a metal precursor from a gas inlet on the frontside of the substrate.

3. The method of claim 2, wherein no metal precursor is flowed from the backside of the substrate.

4. The method of claim 1, wherein flowing the inhibition gas from the gas inlet on the frontside of the substrate is performed concurrently or partially overlaps with flowing the inhibition gas from the backside of the substrate.

5. The method of claim 1, wherein flowing the inhibition gas from the gas inlet on the frontside of the substrate is alternated with flowing the inhibition gas from the backside of the substrate.

6. The method of claim 5, wherein the non-plasma inhibition treatment comprises an anneal period between flowing the inhibition gas from a gas inlet on the frontside of the substrate and flowing the inhibition gas from the backside of the substrate.

7. The method of claim 1, wherein the metal is one of tungsten (W), molybdenum (Mo), cobalt (Co), and ruthenium (Ru).

8. The method of claim 1, wherein the inhibition gas is a nitrogen-containing gas.

9. The method of claim 8, wherein the inhibition gas is ammonia ($NH_3$) or hydrazine ($N_2H_4$).

10. The method of claim 1, further comprising, after the non-plasma inhibition treatment, exposing the features to a metal precursor and a reducing agent to deposit metal in the features, wherein deposition of the metal is delayed on the treated surfaces.

11. The method of claim 10, wherein the non-plasma inhibition treatment and the deposition are performed in different stations of a multi-station chamber.

12. The method of claim 1, wherein providing the substrate having a metal deposited in features in the substrate comprises depositing metal in the features.

13. The method of claim 1, wherein flowing the inhibition gas from the backside of the substrate around the edge of the substrate comprises flowing the inhibition gas from the backside of the substrate to a volume under an exclusion ring.

* * * * *